United States Patent [19]
Andoh

[11] Patent Number: 5,336,914
[45] Date of Patent: Aug. 9, 1994

[54] STATIC SEMICONDUCTOR MEMORY DEVICE

[75] Inventor: Takeshi Andoh, Tokyo, Japan

[73] Assignee: NEC Corporation, Tokyo, Japan

[21] Appl. No.: 901,021

[22] Filed: Jun. 19, 1992

[30] Foreign Application Priority Data

Jun. 19, 1991 [JP] Japan .................. 3-146375

[51] Int. Cl.$^5$ .................. H01L 29/06; H01L 29/78
[52] U.S. Cl. .................. 257/368; 257/379
[58] Field of Search .................. 365/182; 257/368, 379

[56] References Cited

U.S. PATENT DOCUMENTS 4,541,006  9/1985  Arizumi ..................... 365/182
4,780,847  10/1988  Ito .......................... 365/182

Primary Examiner—Sara W. Crane
Assistant Examiner—Stephen D. Meier
Attorney, Agent, or Firm—Sughrue, Mion, Zinn, Macpeak & Seas

[57] ABSTRACT

A MOS SRAM comprising memory cells capable of taking up less areas is disclosed. The flip-flop of a memory cell is connected to a pair of bit lines through a pair of transfer MOSFETs each corresponding to a bit line. At least one, preferably one on the flip-flop side, of the source and drain regions of each transfer MOSFET has a higher resistance. This enables to prevent damage of data which may happen during readout even in the case of use of finer word lines, and therefore contributes to the realization of the SRAM cell taking up relatively less area.

9 Claims, 8 Drawing Sheets

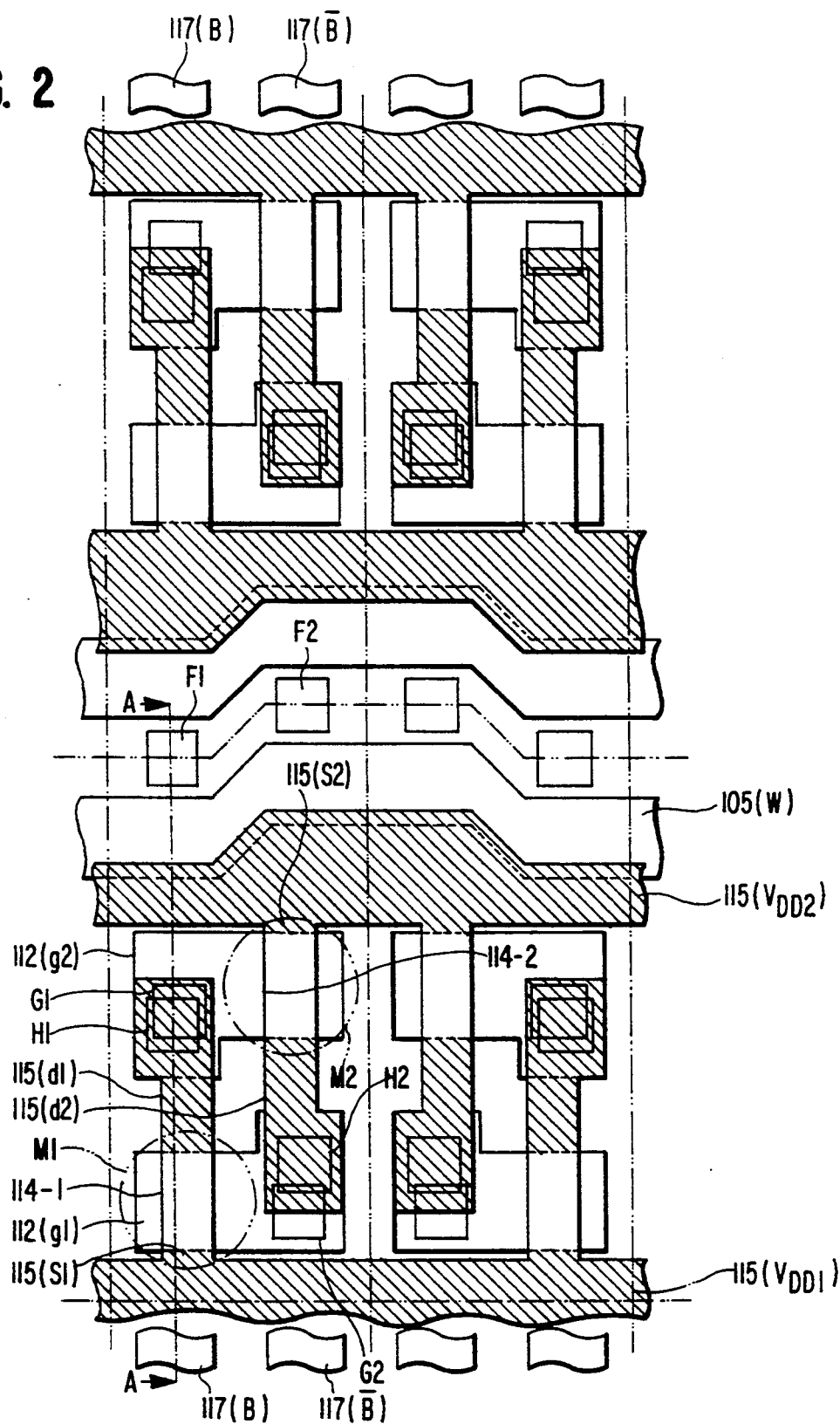

STATIC SEMICONDUCTOR MEMORY DEVICE

BACKGROUND OF THE INVENTION

1. Field of the Invention

This invention relates to a static semiconductor memory device, and more particularly to a SRAM using MOS transistors.

2. Description of the Prior Art

The MOS SRAM memory cell comprises a flip-flop constructed of two (first and second) inverters with inputs and outputs cross-connected. The output (storage node) of each inverter is connected through a transfer MOSFET to a different bit line. The respective gate electrodes of both transfer MOSFETs are connected to the same word line. Each inverter is composed of a drive MOSFET and a load element. The four MOSFETs are of n-channel type. Each load element consists of a high resistance element, p-channel MOSFET, or the like. Each p-channel MOSFET consists of a polysilicon thin-film transistor (referred to as TFT). If headed with the terms "the first" or "the second", those are implied to be associated with the first or second inverter, hereinafter.

Assuming that after the data write into a memory cell, the first storage node of it is at "HIGH" level and the second storage node at "LOW" level, the data read from the memory cell is carried out by charging the potential on the first and second bit lines to the supply voltage, and turning on the first and second transfer MOSFETs. To prevent the data stored in the memory cell from being damaged, the first drive MOSFET must remain "off" and the second drive MOSFET "on".

In the high-resistance load type MOS SRAM, the potential of the second storage node must be up to the threshold voltage of the first drive MOSFET. The potential of the second storage node is determined on the quotient of the difference between supply voltage and ground potential by the on-resistances of the second transfer and drive MOSFETs. Hence the smaller, the better the on-resistance of the second drive MOSFET is while the greater, the better the on-resistance of the second transfer MOSFET. The drive MOSFETs are the same in structure as the transfer MOSFETs except in length and width of channel. The on-resistance of the MOSFET is proportional to the channel length and inversely proportional to the channel width. In order to prevent data damage by keeping the "LOW" storage node potential as it is during readout, therefore the shorter and wider the channel is, the better the drive MOSFET is while the longer and narrower the channel is, the better the transfer MOSFET is. Thus the channel length of the drive MOSFETs and the channel width of the transfer MOSFETs are designed to the respective minimum processible sizes. The channel width of the drive MOSFETs and the channel length of the transfer MOSFETs are designated to be greater than the respective processible sizes. This stands in the way of realization of less area memory cells.

In addition, in the TFT load type MOS SRAM, the potential of the second storage node must be up to logic threshold value of the first inverter. In general ICs as the logic threshold value of the CMOS inverter is usually selected to be about half the supply voltage. On the other hand for TFT load type MOS SRAM it is not so. Since the gain (factor) of the p-channel TFT is as small as about 1/100 that of the same-size drive MOSFET (bulk MOSFET), it follows that the logic threshold value of the inverters constituting a flip-flop is not so different from the threshold voltage of the drive MOSFETs: For example, it becomes about 0.87 V when the threshold voltage of the drive MOSFET is 0.7 V. There are therefore similar problems to those with the high resistance load type MOS SRAM.

SUMMARY OF THE INVENTION

It therefore is the principal object of the present invention to further raise integration level of the static semiconductor memory device.

A static semiconductor memory device of the present invention comprises SRAM cells each consisting of a flip-flop and being connected to two bit lines through a pair of transfer MOSFETs each corresponding to one bit line. The flip-flop is constructed of a pair of inverters each consisting of a drive MOSFET and a load element. The load elements can be either high resistance elements or p-channel TFTs if the drive MOSFETs are of n-channel type. At least one of the transfer MOSFET source and drain regions has a higher electric resistance than has the drive MOSFET drain region. When the drive MOSFETs are LDD MOSFETs, one of the transfer MOSFET source and drain regions, preferably connected to the drive MOSFET, serves also as a diffusion resistor element formed in the same process as for formation of the lightly-doped diffusion layer of the drain region of the LDD MOSFET.

To read information from this SRAM cell, the potentials on the pair of bit lines are charged to the supply voltage, and then the two transfer MOSFETs are turned on. The input voltage of the inverter on the HIGH-written side is determined on the quotient of the difference between supply voltage and ground potential by the on-resistances of the transfer and drive MOSFETs connected to the other inverter. At least one of the transfer MOSFET source and drain regions serves also as diffusion resistor element, and therefore the input voltage can be allowed to be smaller even if the channel of the transfer MOSFET becomes shorter. In this way, turn-on of the drive MOSFET on the HIGH-written side during readout can be prevented, and this can contribute to less-area SRAM cells.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 2 is a schematic plan view of a SRAM cell array, particularly for illustrating the layout of load TFTs, on a semiconductor chip, as described in the first embodiment (The layout of drive MOSFETs and others in the lower portion are referred to FIG. 3);

DETAILED DESCRIPTION OF THE PREFERRED EMBODIMENTS

Figure 1:
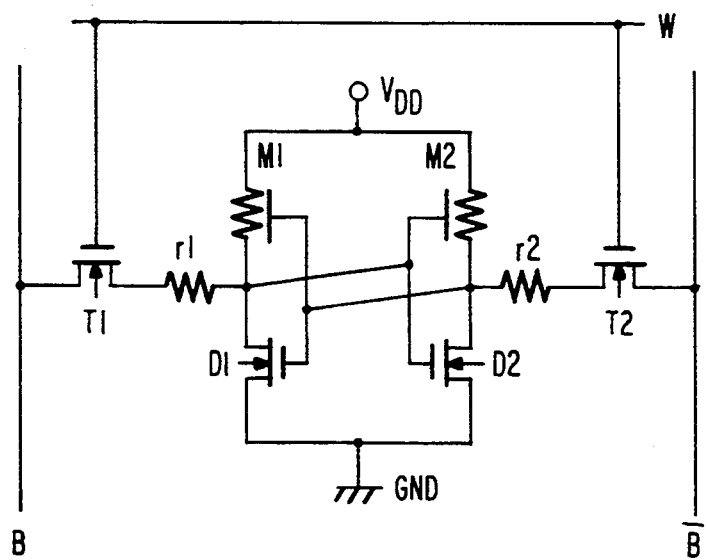
FIG. 1 is a circuit diagram of the SRAM cell as described in the first embodiment of the present invention.

The first embodiment of the present invention will be described with reference to FIGS. 1 through 4. FIG. 1 diagrams the SRAM cell circuit which comprises a flip-flop composed of a pair of inverters. The first inverter consists of a n-channel drive MOSFET D1 and a p-channel TFT M1, and the second inverter consists of a n-channel drive MOSFET D2 and a p-channel TFT M2. The source regions of p-channel TFTs M1, M2 is connected to a common supply voltage $V_{DD}$. The source regions of n-channel drive MOSFETs D1, D2 are both connected to ground terminal GND. A n-channel transfer MOSFET T1 is inserted between a first bit line B and the drain region of n-channel drive MOSFET D1, and another n-channel drive MOSFET T2 between the second bit line $\overline{B}$ and the drain region of n-channel drive MOSFET D2. Either source or drain region of n-channel MOSFET T1 connecting to n-channel drive MOSFET D1 (Herein "source region") serves also as resistor r1. Similarly either region (Herein source region) of n-channel drive MOSFET D2 serves also as resistor r2. The gate electrodes of n-channel transfer MOSFETs T1, T2 are connected to a common word line W.

Figure 3:
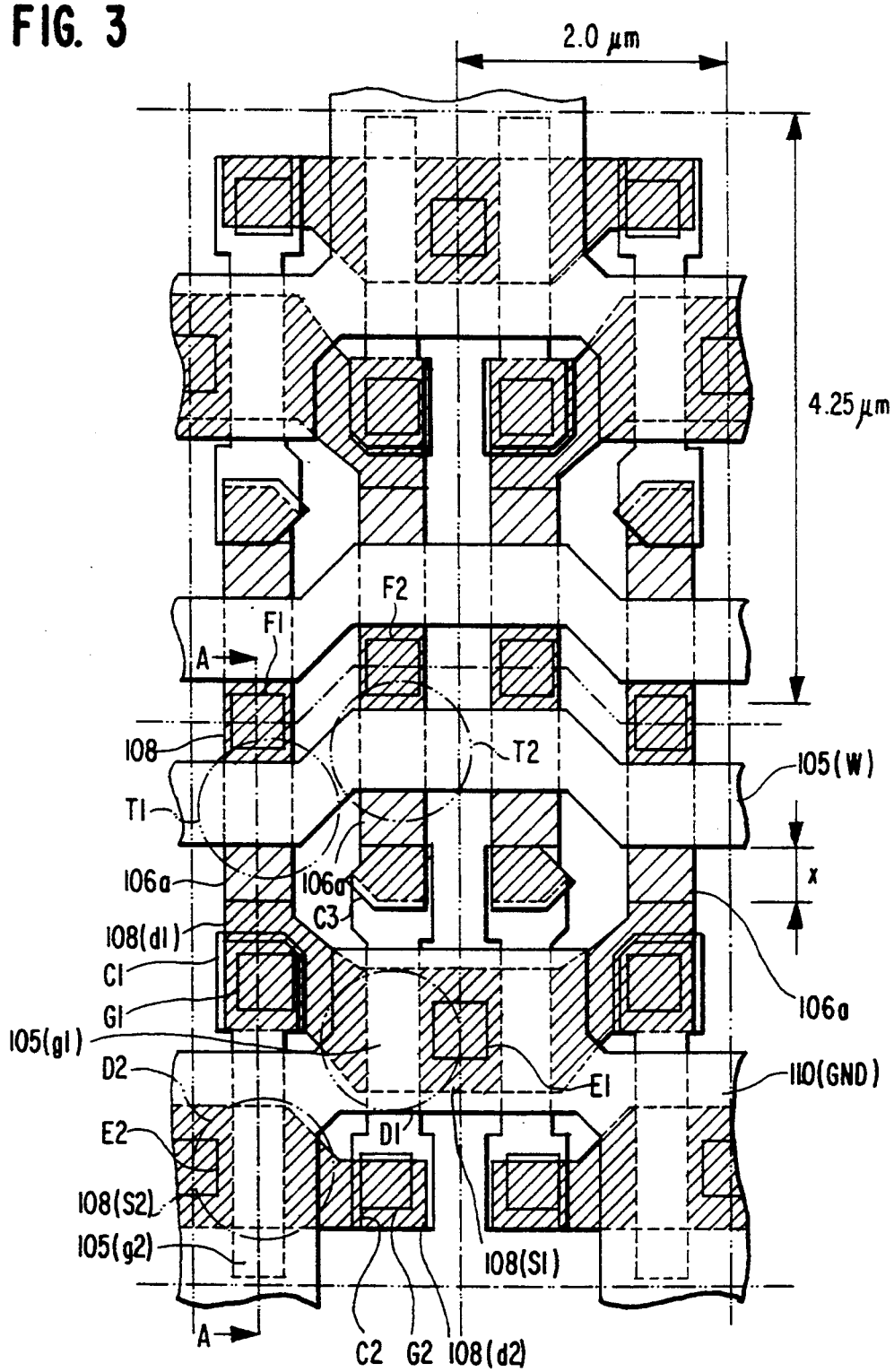
FIG. 3 is a schematic plan view of a SRAM cell array, particularly for illustrating the layout of drive MOSFETs and transfer MOSFETs.

FIGS. 2 and 3 illustrate partially the SRAM cell array of this embodiment. FIG. 2 is the layout including drive MOSFETs in the lower part on the semiconductor chip. In the Figures the two-dot-and-dash line indicates the border between SRAM cells.

Figure 4A:
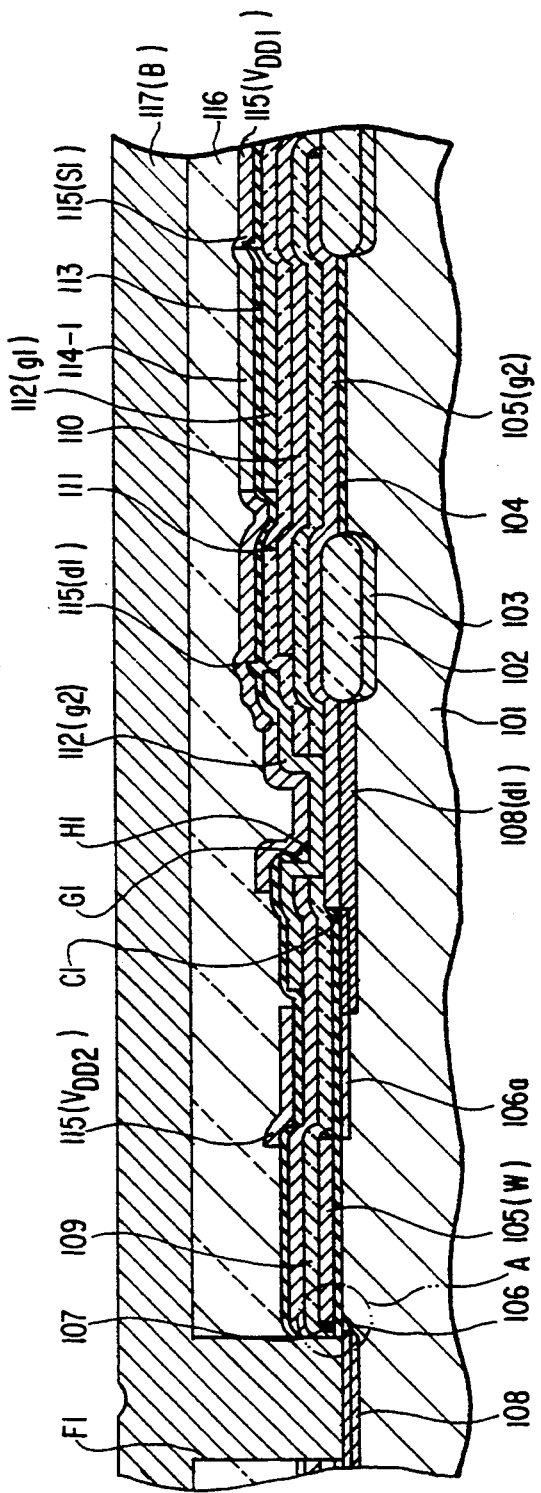
FIG. 4(a) is a schematic cross-sectional view of the semiconductor chip taken along the line A—A of FIG. 2.
Figure 4B:
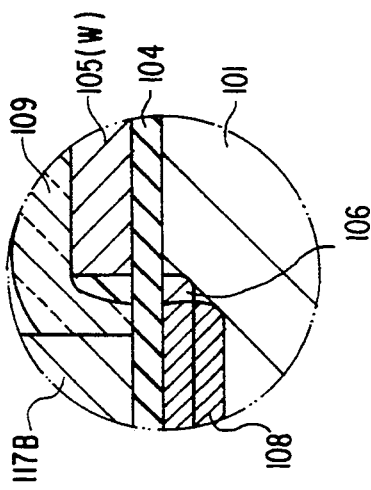
FIG. 4 (b) is an enlarged view of a spot "A" in FIG. 4 (a)

Referring to FIGS. 3 and 4, on the surface of a p-type silicon substrate 101 are locally formed field oxide films 102, each overlying a channel stopper 103, to define active areas. Over these active areas are formed gate oxide films 104 of 10 to 20 nm thick. Polysilicon or polycide films, 200 to 400 nm thick, extending on the gate oxide layer 104 and across the active areas are locally formed. These constitute word lines 105 (W) serving also as common gate electrodes to n-channel transfer MOSFETs T1, T2, and gate electrodes 105 (g1), 105 (g2) of n-channel drive MOSFETs D1, D2, respectively. In self-alignment with the gate electrodes, lightly-doped n-type diffusion layers 106, 106a (indicated with rough hatching) of $1 \times 10^{18}$ cm$^{-3}$ in impurity concentration are formed in the active areas. Sidewall spacers 107 of oxide silicon film and having a thickness of 100 to 200 nm are formed at the side of the gate electrode. In self-alignment with the side spacers 107, high-doped n-type diffusion layers 108 (indicated with dense hatching) are formed. Besides in the source regions of transfer MOSFETs T1, T2, lightly-doped n-type diffusion layers 106a extend a specified distance "X" from word line 105 (W) to connect to high-doped n-type diffusion layers 108 (d1) in the drain region of drive MOSFET D1. Each gate electrode 105 (g1), 105 (g2) is connected through direct contacts C2, C1, respectively, to high-doped diffusion layers 108 (d2), 108 (d1), respectively. On the surface of an insulating layer 109, tungsten silicide film 110 is formed, which connects via contact holes E1, E2, respectively, to high-doped n-type diffusion layers 108 (s1), 108 (s2). Tungsten silicide layer 110 is grounded.

Referring to FIGS. 2 and 4, on insulating layer 111 are locally formed n-type polysilicon films 112, each constituting gate electrodes 112 (g1), 112 (g2). The construction involving gate electrode 112 (g2) is the same as that of electrode 112 (g1), and hence the description of it is omitted except that the corresponding reference characters are placed within brackets at the side of those of electrode 112 (g2). Gate electrode 112 (g1) [112 (g2)] connects via a through hole G1 [G2] to a gate electrode 105 (g1) [105 (g2)] of transfer MOSFET D1 [D2]. On the surface of gate electrode 112 (g1) [112 (g2)], a gate oxide film 113 of 10 to 20 nm thick is formed, and in turn on this a n-type polysilicon film 114-1 [114-2] is formed. n-type polysilicon film 114-1 [114-2] is connected to a p-type polysilicon film 115 (d1) [115 (d2)] constituting the drain region, and to a p-type polysilicon film 115 (s1) [115 (s2)] constituting the drain region of TFTs M1 [M2]. p-type polysilicon film 115 (s1) [115 (s2)] connects to an in-cell supply line of p-type polysilicon film 115 (VDD1) [115 (VDD2)]. p-type polysilicon film 115 (d1) [115 (d2)] connects via a through hole H1 [H2] to gate electrode 112 (g2) [112 (g1)]. On an insulating layer 116 is formed a bit line 117B 117B of an aluminum-alloy film 117, which connects via a contact hole F1 [F2] to the drain region of transfer MOSFET T1 [T2]. Similarly in-cell supply leads 115 (VDD1), 115 (VDD2) may be connected, for example, every 64 bits, to the aluminum-alloy film leads (not shown) connected to the positive supply voltage and running in the same direction as bit lines.

Figure 5A:
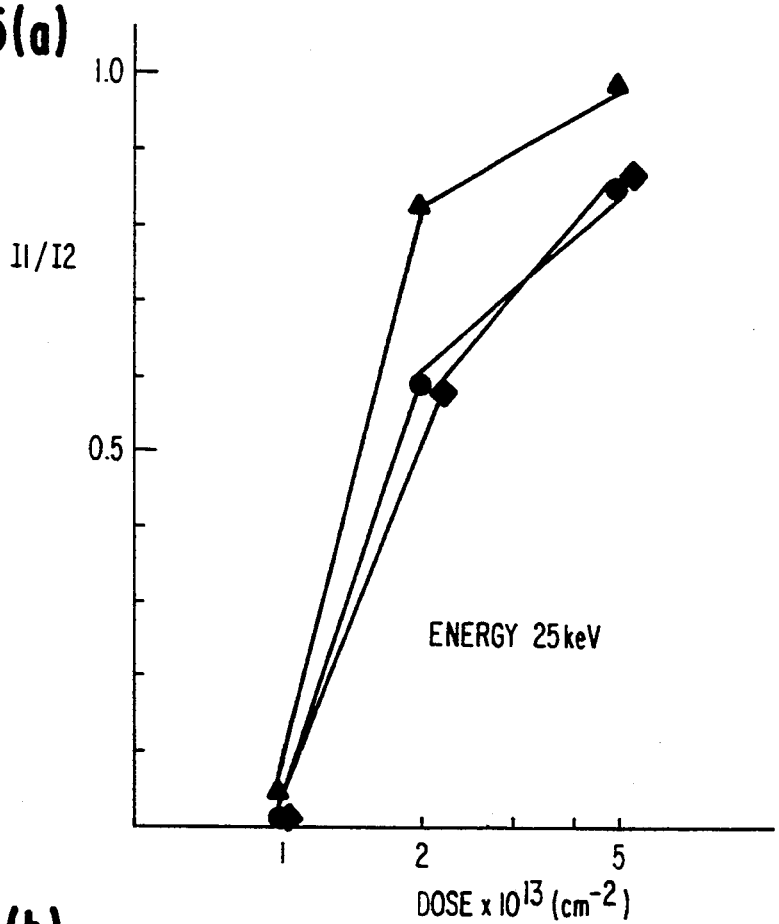
FIG. 5 (a) is a graph showing the relationship of the ratio I1/I2 (I1 is on-current of MOSFET of which the source or drain region serving also as resistor element and I2 is on-current of LDD MOSFET) to phosphorus implantation (acceleration voltage: 25 keV) dose for formation of lightly-doped diffusion layer.
FIG. 5(b) is the same graph as FIG. 5(a) except acceleration voltage of 40 keV.
Figure 5B:
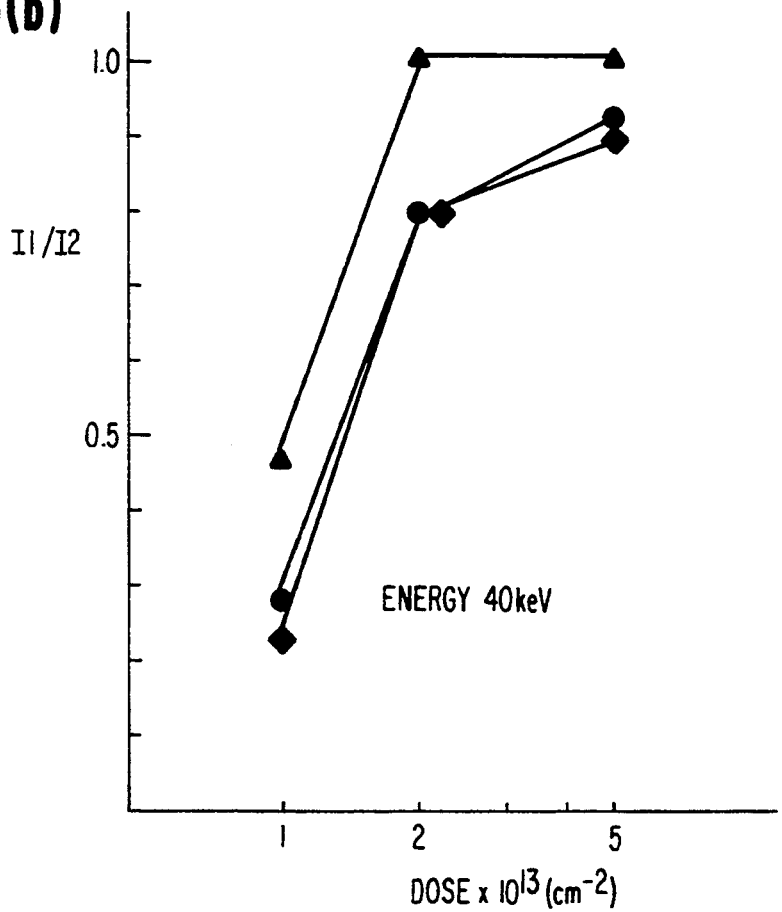

FIGS. 5(a) and 5(b) show the relationship of the ratio between the respective on-currents I1 and I2 of transfer and LDD MOSFETs, to the ion-implanted phosphorus dose for formation of a lightly-doped diffusion layer. In these Figures, black circles, triangles and quadrangles represent practically-determined values in the cases where the source (like transfer MOSFET of the first embodiment), drain, and both regions, respectively, serve(s) as resistor(s). FIGS. 5 (a) and 5 (b) show the relationships at implantation acceleration voltages of 25 and 40 keV, respectively. The gate length $L_t$ of the MOSFET measured 0.6 82 m, and gate width 0.4 μm. Lightly-doped n-type diffusion layer 106a of transfer MOSFET had a length of 0.4 μm (indicated by "X" in FIG. 3). Besides the drain and gate voltages are both 3.3 V. As understood from these graphs, the source regions are preferred to serve also as resistors. This corresponds to that the drain current of MOSFET can be expressed by a quadratic function of gate-source voltage in the saturated region.

For the purpose of preventing the damage of data which may happen during readout, the greater, as described above, the better the on-resistance of the transfer MOSFET is while the smaller, the better the on-resistance of the drive MOSFET is. From the viewpoint like this, cell ratio "R": the ratio of the on-current of the drive MOSFET to that of the transfer MOSFET is designed, for instance, to 4.5. This ratio "R" can be realized by forming lightly-doped n-type diffusion layer 106a under the conditions: the length $L_a$ and width $W_a$ of the drive MOSFET channel 0.4 μm (the minimum processible size) and 0.8 μm, respectively, and those $L_t$ and $W_t$ of the transfer MOSFET to 0.6 and 0.4 μm, respectively; acceleration voltage 25 or 40 keV; and phosphorus implantation dose $3 \times 10^{13}$ cm$^{-2}$ or $1.7 \times 10^{13}$ cm$^{-2}$. The conditions are proper to form lightly-doped diffusion layer 106 of LDD-type MOSFET. In the case of LDD-type transfer MOSFET, the channel length must measure 0.9 μm to achieve R=4.5. Thus the SRAM cell of this embodiment takes up 2.0 μm×4.25 μm. In FIG. 3, the source region 106a of transfer MOSFET is needed to have at least the minimum processible size 0.4 μm independent of the concentration. In the prior art, therefore, taking it into consideration to be required for the width of word line 105 (W) to be set to 0.9 μm, 2.0 μm×4.55 μm is obtained as the area taken up by the SRAM cell.

Figure 6:
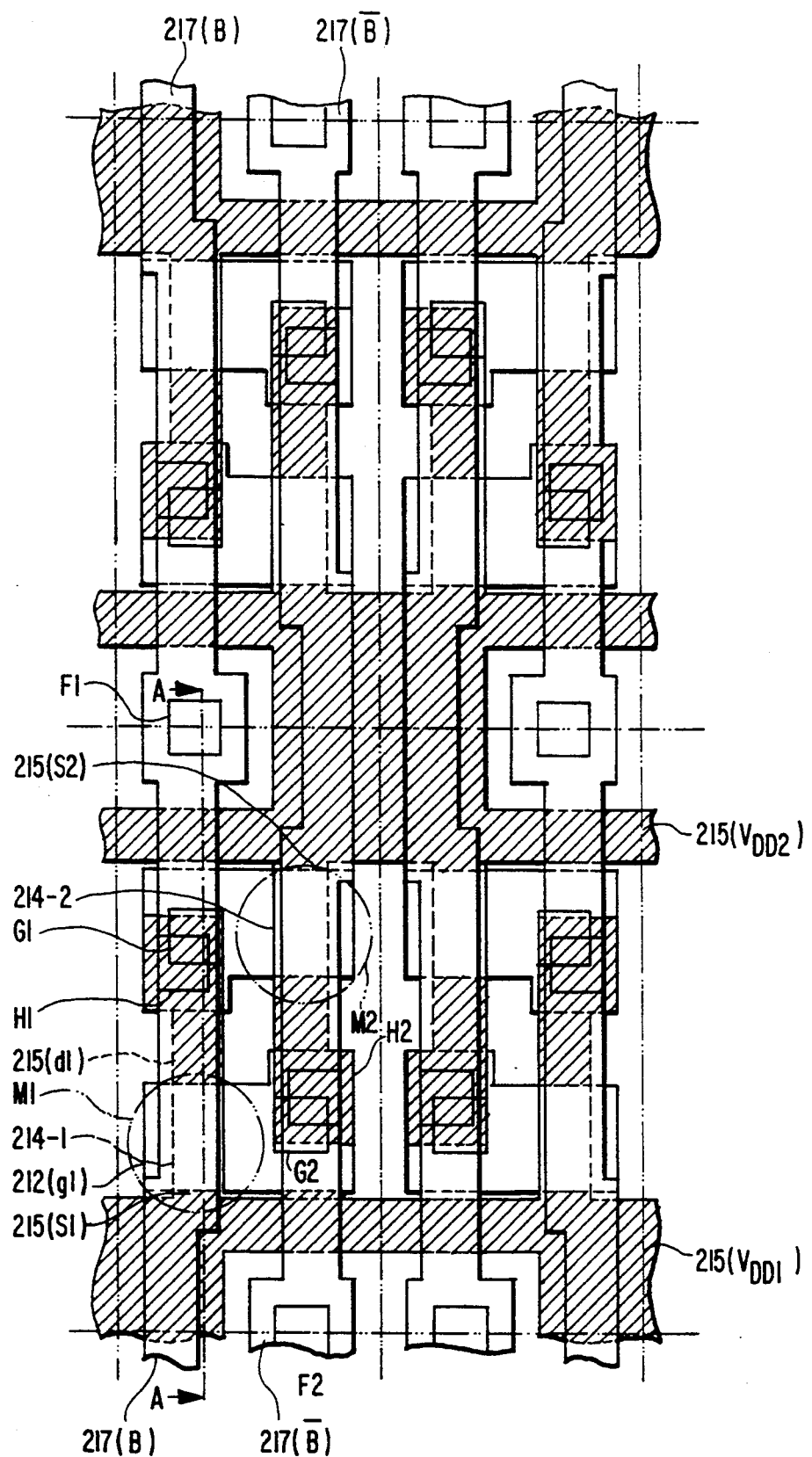
FIG. 6 is a schematic plan view corresponding, and similarly illustrating the second embodiment, to FIG. 2, for illustrating the first embodiment.
Figure 7:
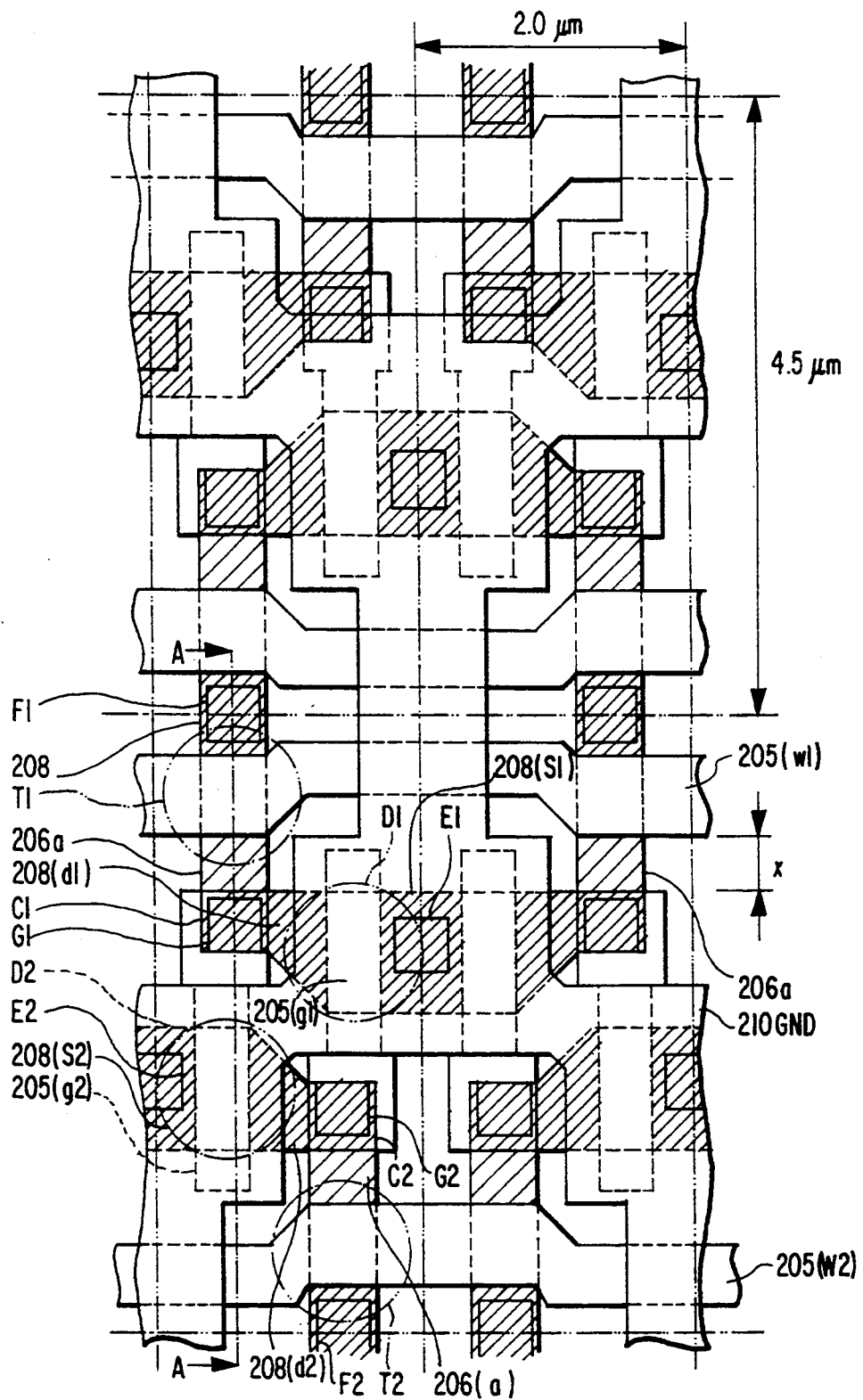
FIG. 7 is a schematic plan view, similar to FIG. 3, for illustrating the second embodiment.
Figure 8:
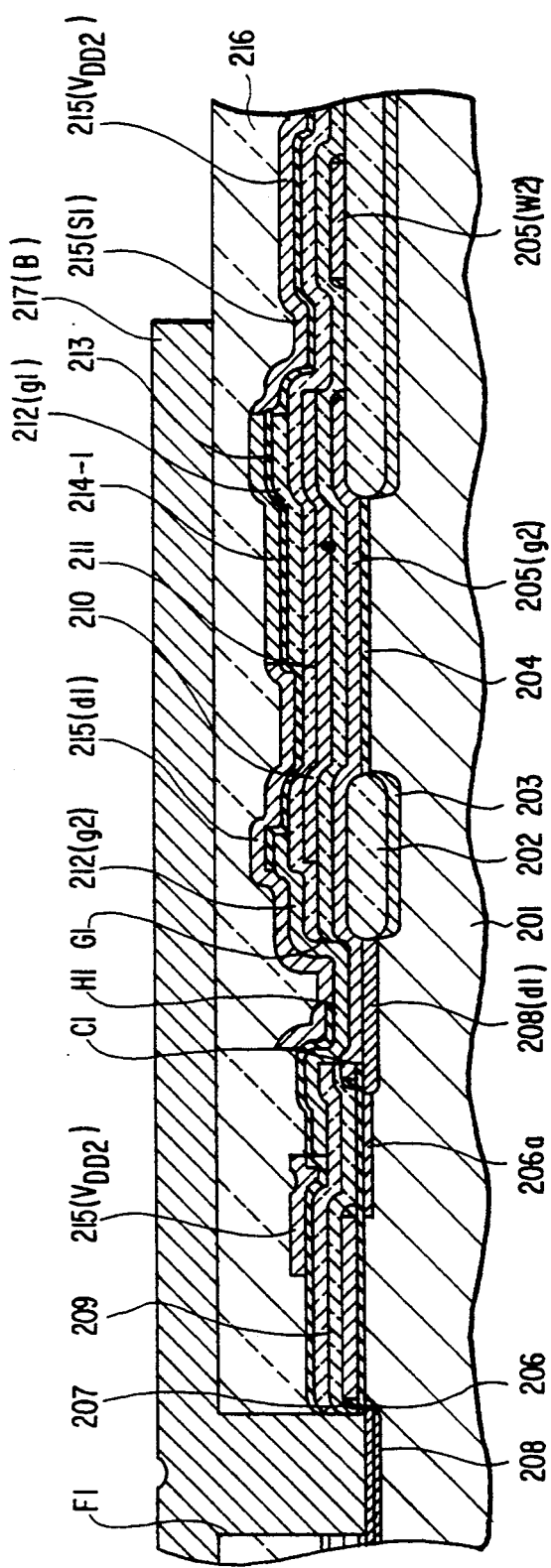
FIG. 8 is a schematic cross-sectional view, similar to FIG. 4, for illustrating the second embodiment.

The second embodiment of the present invention illustrated in FIGS. 6 through 8 is a point-symmetrical type memory cell to which the present invention is applied. Referring to FIG. 7, n-channel transfer MOSFETs T1, T2 are disposed in point symmetry and hence two in-cell word lines 205 (W1), 205 (W2) are needed. These meets outside of the SRAM cell array, and are connected to a decoder (not shown). The source regions of n-channel transfer MOSFETs T1, T2 include a lightly-doped n-channel diffusion layer 206a (length "X" is the minimum processible size of 0.4 μm). Hence, for the same reason as described in the first embodiment, compared with the prior art, the SRAM cell could be shortened by 0.3 μm×2 in length and consequently reduced from 2.0 μm×5.1 μm to 2.0 μm×4.5 μm in area.

Reference characters designate components of the SRAM cell as follows: 201a p-type silicon substrate; 202 field oxide films; 203a channel stopper; 204a gate oxide film; 205a polycide film; 205 (W1) and 205 (W2) in-cell word lines each consisting of polycide film and serving as gate electrode of n-channel transfer MOSFETs T1, T2, respectively; 205 (g1), 205 (g2) respective gate electrodes of n-channel drive MOSFETs D1, D2; 206, 206a lightly-doped n-type diffusion layers; 207a side-wall spacer; 208a high-doped n-type diffusion layer; 208 (d1), 208 (d2) respective drain regions of n-channel drive MOSFETs D1, D2; 208 (s1), 208 (s2) respective source regions of n-channel drive MOSFETs D1, D2; 209 an insulating layer; 210 (GND) grounded line of tungsten silicide film; 211a insulating layer; 212 (g1), 212 (g2) respective gate electrodes of TFTs M1, M2, consisting of n-type polysilicon film; 213 gate oxide layer of TFTs; 214-1, 214-2 n--type polysilicon film; 215 (d1), 215 (s1) the drain and source regions of TFT M1, consisting of p-type polysilicon film; 215 (d2), 215 (s2) the drain and source regions of TFT M2, consisting of p-type polysilicon film; 205 (VDD1), 215 (VDD2) respective in-cell supply lines of TFTs M1, M2, consisting of p-type polysilicon film; 216an insulating layer, 217B, 217B bit lines B, B of an aluminum-alloy film; C1, C2 direct contacts between 208 (D1) and 205 (g2), and between 208 (D2) and 205 (g2), respectively; E1, E2 contact holes through each of which 208 (s1) and 208 (s2) are connected to 210 (GND); F1, F2 contact holes via each of which the drain of transfer MOSFETs D1, D2 are each connected to 217 (B), 217 (B̄), respectively; G1, G2 through holes via each of which 212 (g2), 212 (g1) are each connected to 205 (g2), 205 (g1), respectively; and H1, H2 through holes via each of which 215 (d1), 215 (d2) are each connected to 212 (g2), 212 (g1), respectively.

Figure 9:
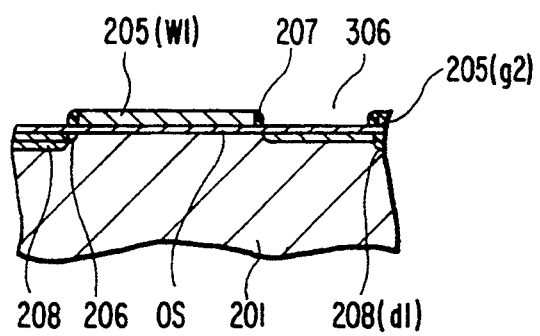
FIG. 9 is a schematic cross-sectional view of the transfer MOSFET as described in the third embodiment of the present invention.

The third embodiment of the present invention is distinguished from the second embodiment described above in the respect that in each n-channel transfer MOSFET T1, T2 the lightly-doped n-type diffusion layer 306 of the source region is offset with respect to the end of gate electrode 205 (W1) as shown in FIG. 9. The offset structure results in great resistance of the source region compared with the second embodiment, and in turn contributes to preventing damage of data with higher certaintly. In the process, after such as photoresist film is previously formed on an area where lightly-doped n-type diffusion layer 306 is to be formed, lightly-doped n-type diffusion layer 206 is formed by ion implantation using the photoresist film as mask. Then a side spacer 207 is made, and again ion implantation is carried out using a suitable mask to form lightly-doped n-channel diffusion layer 306. The conditions of the implantation can be set dependent of lightly-doped n-type diffusion layer 206, which enables to set the word line width to the minimum processible size (0.4 μm) and in turn SRAM cells taking up less cell areas can be built.

It will be obvious to those skilled in the art that the above-described drive MOSFETs with LDD structure should not be considered as limiting but drive MOSFETs may have source/drain regions not of LDD structure but of a single high-doped diffusion layer, and transfer MOSFETs may have source/drain regions of a single lightly-doped diffusion layer. Similarly it will be obvious that the present invention can be applied to high resistance load type SRAM instead of to TFT load type described above.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor memory device having a plurality of memory cells formed in a semiconductor substrate,
    each of said memory cells comprising:
    (a) a first inverter composed of a first drive MOSFET and a first load element;
    (b) a second inverter composed of a second drive MOSFET and a second load element;
    (c) first and second transfer MOSFETs;
    (d) a first resistive element connected between said first transfer MOSFET and a second node; and
    (e) a second resistive element connected between said second transfer MOSFET and a first node,
    said first drive MOSFET having a gate connected to said second load element at the first node,
    said first node being further connected to said second drive MOSFET,
    said second drive MOSFET having a gate connected to said first load element at the second node, and
    said second node being further connected to said first drive MOSFET, wherein said first transfer MOSFET is connected to a first bit line and said second transfer MOSFET is connected to a second bit line,
said first and second drive MOSFETs are connected in common to a reference potential point,
and the following two equations are satisfied:
$R_1 > R_2$; and
$R_3 > R_4$,
where
$R_1$ is the resistance between said second node and said first bit line, and comprises the resistance of said first transfer MOSFET and the resistance of said first resistive element,
$R_2$ is the resistance between said second node and said reference potential point, and comprises the resistance of said first drive MOSFET,
$R_3$ is the resistance between said first node and said second bit line, and comprises the resistance of said second transfer MOSFET and the resistance of said second resistive element, and
$R_4$ is the resistance between said first node and said reference potential point, and comprises the resistance of said second drive MOSFET.

2. A semiconductor memory device having a plurality of memory cells formed in a semiconductor substrate,
each of said memory cells comprising:
(a) a first inverter composed of a first drive MOSFET and a first load element;
(b) a second inverter composed of a second drive MOSFET and a second load element;
(c) first and second transfer MOSFETs;
(d) a first resistive element connected between said first transfer MOSFET and a second node; and
(e) a second resistive element connected between said second transfer MOSFET and a first node,
said first drive MOSFET having a gate connected to said second load element at the first node,
said first node being further connected to said second drive MOSFET,
said second drive MOSFET having a gate connected to said first load element at the second node, and
said second node being further connected to said first drive MOSFET, wherein
the first resistive element comprises a first impurity region formed in said semiconductor substrate,
said first impurity region further serves as one of source and drain regions of said first transfer MOSFET and has an impurity concentration lower than the impurity concentration of the drain region of said first drive MOSFET,
said second resistive element comprises a second impurity region formed in said semiconductor substrate, and
said second impurity region further serves as one of source and drain regions of said second transfer MOSFET and has an impurity concentration lower than the impurity concentration of the drain region of said second drive MOSFET.

3. A semiconductor memory device having a plurality of memory cells formed in a semiconductor substrate, each of said memory cells comprising:
a first drive MOSFET and a first load element connected in series between first and second power supply lines;
a second drive MOSFET and a second load element connected in series between said first and second power supply lines;
a first transfer MOSFET connected between a first bit line and a first connection point of said first drive MOSFET and said first load element; and
a second transfer MOSFET connected between a second bit line and a second connection point of said second MOSFET and said second load element,
each of said first and second drive MOSFETs including a first lightly doped region having a first end portion defining a channel region thereof, and a first heavily doped region formed in contact with said first lightly doped region,
each of said first and second transfer MOSFETs including a second lightly doped region having a second end portion defining a channel region thereof, and a second heavily doped region formed in contact with said second lightly doped region, such that
the distance between said second end portion and said second heavily doped region is larger than the distance between said first lightly doped region and said first heavily doped region, whereby a resistance is provided between each of said first and second transfer MOSFETs and an associated one of the first and second connection points.

4. The memory device as claimed in claim 3, wherein said first load element comprises a first thin film transistor and a second load element comprises a second thin film transistor.

5. The memory device as claimed in claim 4, wherein said first thin film transistor has a gate which further serves as a gate of said second drive MOSFET, and
said second thin film transistor has a gate which further serves as a gate of said first drive MOSFET.

6. A semiconductor memory device having a plurality of memory cells formed in a semiconductor substrate, each of said memory cells including:
a flip-flop having first and second input/output nodes;
a first transfer MOSFET connected between said first input/output node and a first bit line; and
a second transfer MOSFET connected between said second input/output node and a second bit line,
said first transfer MOSFET including a first region having a first end portion and a second region having a second end portion,
said second transfer MOSFET including a third region having a third end portion and a fourth region having a fourth end portion,
said first and second end portions defining a first channel region of said first transfer MOSFET,
said third and fourth end portions defining a second channel region of said second transfer MOSFET,
said first region further having a first contact portion which is in contact with said first bit line,
said second region further having a second contact portion which is electrically connected with said first input/output node,
said third region further having a third contact portion which is in contact with said second bit line, and
said fourth region further having a fourth contact portion which is electrically connected to said second input/output node,
such that the distance between said first end portion of said first region and said first contact portion of said first region is smaller than the distance between said second end portion of said second region and said second contact portion of said second region, and such that the distance between said third end portion of said third region and said third contact portion of said third region is smaller than the distance between said fourth end portion of said fourth region and said fourth contact portion of said fourth region.

7. The memory device as claimed in claim 6, wherein said second contact portion has an impurity concentration higher than an impurity concentration of a first remaining portion of said second region, and
said fourth contact portion has an impurity concentration higher than an impurity concentration of a second remaining portion of said fourth region.

8. The memory device as claimed in claim 7, wherein said first remaining portion serves as a first resistive element connected between said first transfer MOSFET and said first input/output node, and
said second remaining portion serves as a second resistive element connected between said second transfer MOSFET and said second input/output node.

9. The memory device as claimed in claim 7, wherein said first and third regions are covered by insulating film,
said first contact portion is defined by a first contact hole formed in said insulating film,
said third contact portion is defined by a second contact hole formed in said insulating film,
said first bit line is connected to said first contact portion through said first contact hole, and
said second bit line is connected to said third contact hole through said second contact hole.

* * * * *

UNITED STATES PATENT AND TRADEMARK OFFICE
CERTIFICATE OF CORRECTION

PATENT NO. : 5,336,914
DATED : August 9, 1994
INVENTOR(S) : Takeshi Andoh

It is certified that error appears in the above-indentified patent and that said Letters Patent is hereby corrected as shown below:

Column 4, line 53, delete "82m", and insert --μm--.

Signed and Sealed this

Twenty-fifth Day of October, 1994

Attest:

BRUCE LEHMAN

*Attesting Officer*  *Commissioner of Patents and Trademarks*